United States Patent
Zhu et al.

(10) Patent No.: US 8,754,681 B2
(45) Date of Patent: Jun. 17, 2014

(54) MULTI-PART CLOCK MANAGEMENT

(75) Inventors: Julianne J. Zhu, Los Gatos, CA (US);
David T. Hass, Santa Clara, CA (US)

(73) Assignee: NetLogic Microsystems, Inc., Irvine, CA (US)

(*) Notice: Subject to any disclaimer, the term of this patent is extended or adjusted under 35 U.S.C. 154(b) by 194 days.

(21) Appl. No.: 13/163,605

(22) Filed: Jun. 17, 2011

(65) Prior Publication Data

US 2012/0319750 A1 Dec. 20, 2012

(51) Int. Cl.
*H03L 7/06* (2006.01)

(52) U.S. Cl.
USPC ............ 327/147; 327/156; 713/500; 713/503

(58) Field of Classification Search
USPC ..................... 327/147, 156; 375/373, 376; 713/500–503
See application file for complete search history.

(56) References Cited

U.S. PATENT DOCUMENTS

| | | | |
|---|---|---|---|
| 6,433,645 B1* | 8/2002 | Mann et al. | 331/18 |
| 7,216,249 B2* | 5/2007 | Fujiwara et al. | 713/501 |
| 7,689,856 B2* | 3/2010 | Godiwala | 713/600 |
| 7,940,132 B2* | 5/2011 | May et al. | 331/74 |
| 2006/0101300 A1* | 5/2006 | Singer et al. | 713/500 |
| 2007/0208964 A1 | 9/2007 | Sandon et al. | |
| 2008/0028249 A1 | 1/2008 | Agrawal | |
| 2009/0085620 A1 | 4/2009 | May et al. | |
| 2009/0115472 A1 | 5/2009 | Pfaff et al. | |
| 2009/0278574 A1* | 11/2009 | Kao et al. | 327/115 |
| 2011/0001571 A1 | 1/2011 | Sutardja | |
| 2011/0051486 A1 | 3/2011 | Chang et al. | |

OTHER PUBLICATIONS

International Search Report for related International Application No. PCT/US12/42697, ISA/US, Alexandria, Virginia; 8 pages, Sep. 2012.
International Preliminary Report on Patentability directed toward related to International Application No. PCT/US2012/042697, issued Dec. 17, 2013 from The International Bureau of WIPO, Geneva, Switerzland; 7 pages.

\* cited by examiner

*Primary Examiner* — Patrick O'Neill
(74) *Attorney, Agent, or Firm* — Sterne, Kessler, Goldstein & Fox PLLC

(57) ABSTRACT

An improved approach is described for implementing a clock management system. A multi-part phase locked loop circuit is provided to handle the different clock needs of the circuit, where each of the phase locked loops within the multi-part phase locked loop circuit may feed a clock output to one or more divider circuits. The divider circuits may be dedicated to specific components. For example, a SoC PLL may generate a clock output to a SoC divider that is dedicated to providing a clock to content address memory (CAM) components. This approach allows the clock management system to efficiently generate clock signals with variable levels of frequencies, even for complicated circuits having many different functional portions and components.

14 Claims, 5 Drawing Sheets

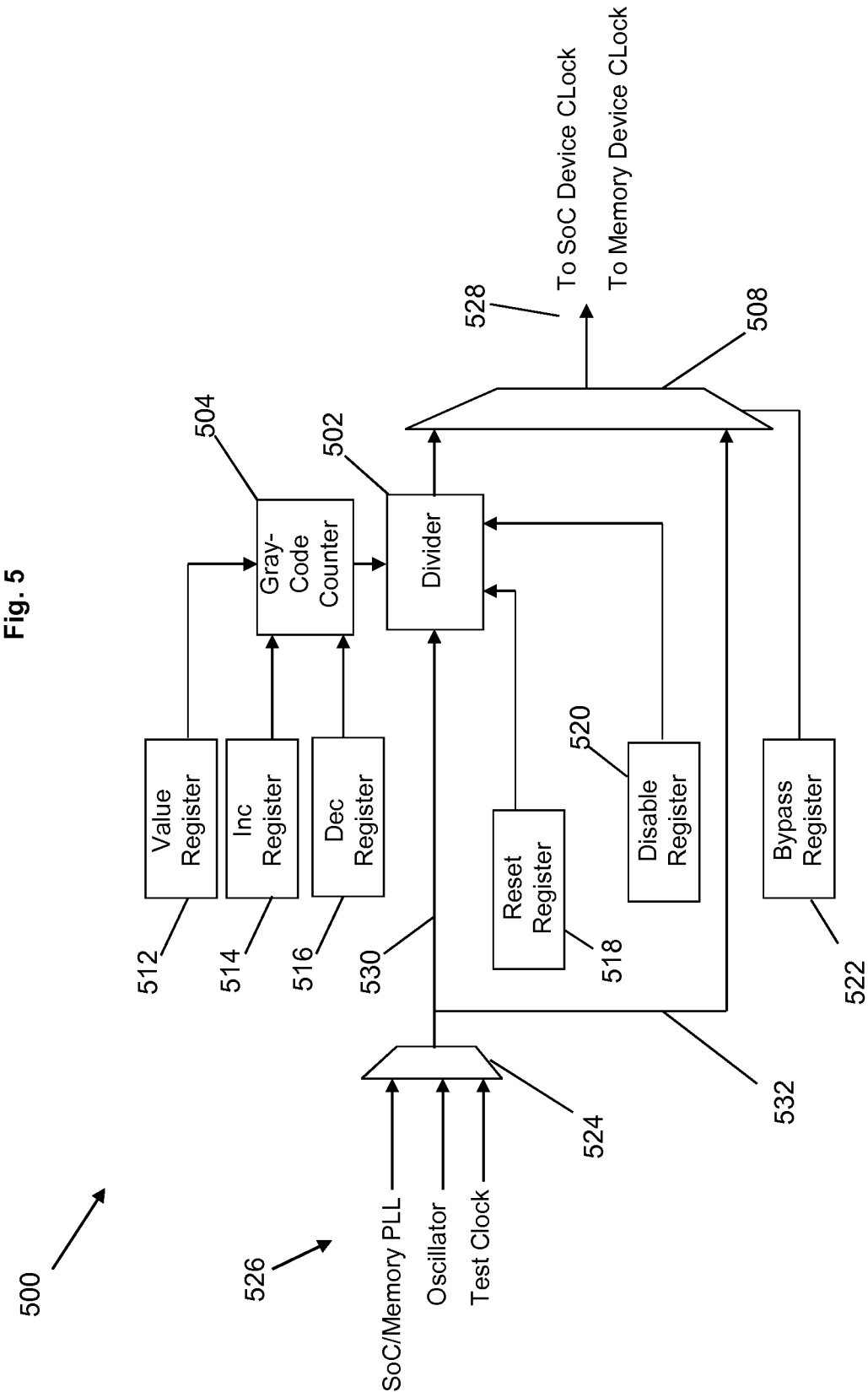

MULTI-PART CLOCK MANAGEMENT

FIELD OF THE INVENTION

The present disclosure relates to clock management systems.

BACKGROUND

Clock synthesis circuits are used to generate clock signals. Typically, the clock signals provide timing for operation of a circuit. In some applications, multiple timing references or clocks, which operate at different frequencies, are required. For example, some communication standards require operation of transmitter and receiver circuits at pre-determined clock frequencies. If a circuit supports multiple timing references, then multiple clock synthesis circuits are used.

Some circuit applications require a variable frequency clock. In general, a variable frequency clock is a clock that may change its frequency over time or for different purposes. There are many reasons why it is important to be able to vary the clock frequency that is used for timing in a computing system. For example, it is often important to vary the clock frequency in a computer system because of an interface between different controllers and components in the system.

A complicated circuit may require many different variances to the clock frequency for different portions of the circuit. The different required clock frequencies may span a very large and disparate range of different frequencies. In addition, the different clock frequencies may need to be directed to many different parts of the circuit.

SUMMARY

An improved approach is described for implementing a clock management system. According to some embodiments, a multi-part phase locked loop circuit is provided to handle the different clock needs of the circuit. The multi-part phase locked loop circuit includes a first PLL (phase locked loop) for processor components, a second PLL for memory components, and a third PLL for SoC components. Each of the phase locked loops within the multi-part phase locked loop circuit may feed a clock output to one or more divider circuits. The divider circuits may be dedicated to specific components. For example, the SoC PLL may generate a clock output to a SoC divider that is dedicated to providing a clock to content address memory (CAM) components. This approach allows the clock management system to efficiently generate clock signals with variable levels of frequencies, even for complicated circuits having many different functional portions and components.

Other and additional objects, features, and advantages of the invention are described in the detailed description, figures, and claims.

BRIEF DESCRIPTION OF THE DRAWINGS

FIG. 5 shows a diagram of an alternate divider circuit to receive a clock output from a multi-part PLL circuit.

DETAILED DESCRIPTION

Embodiments will now be described in detail with respect to the drawings, which are provided as illustrative examples so as to enable those skilled in the art to practice the invention. Notably, the figures and examples below are not meant to limit the scope of the present disclosure to a single embodiment, but other embodiments are possible by way of interchange of some or all of described or illustrated embodiments. Whenever convenient, the same reference numbers will be used throughout the drawings to refer to the same or like parts. Where certain elements of the these embodiments can be partially or fully implemented using these known components, only those portions of known components that are necessary for understanding of the embodiment will be described, and details descriptions of other portions of such known components will be omitted so as to not obscure the description of the invention. In the present specification, an embodiment showing a singular component should not be considered to be limiting; rather, the scope is intended to encompass other embodiments including a plurality of the same components, and vice versa, unless explicitly stated otherwise. Further, the present disclosure encompasses present and future known equivalents to the components referred to by way of illustration.

Some embodiments are directed to an improved approach for implementing a clock management system. In a complicated system having many different components and subsystems, it is likely that the different system portions will need to have clock frequencies that differ from one another. As an example, consider a modern multiprocessing system that has multiple processors, multiple memory components (e.g., DRAMs), and multiple specialized subsystems on the chips/system, where these components or subsystems may have clock requirements that greatly differ from one another.

A multi-part phase locked loop circuit is provided to handle the different clock needs of the circuit, where each of the phase locked loops within the multi-part phase locked loop circuit may feed a clock output to one or more divider circuits. The divider circuits may be dedicated to specific components. For example, a SoC PLL may generate a clock output to a SoC divider that is dedicated to providing a clock to content address memory (CAM) components. This approach allows the clock management system to efficiently generate clock signals with variable levels of frequencies, even for complicated circuits having many different functional portions and components, and therefore different clock needs for the different portions of the system.

Figure 1:
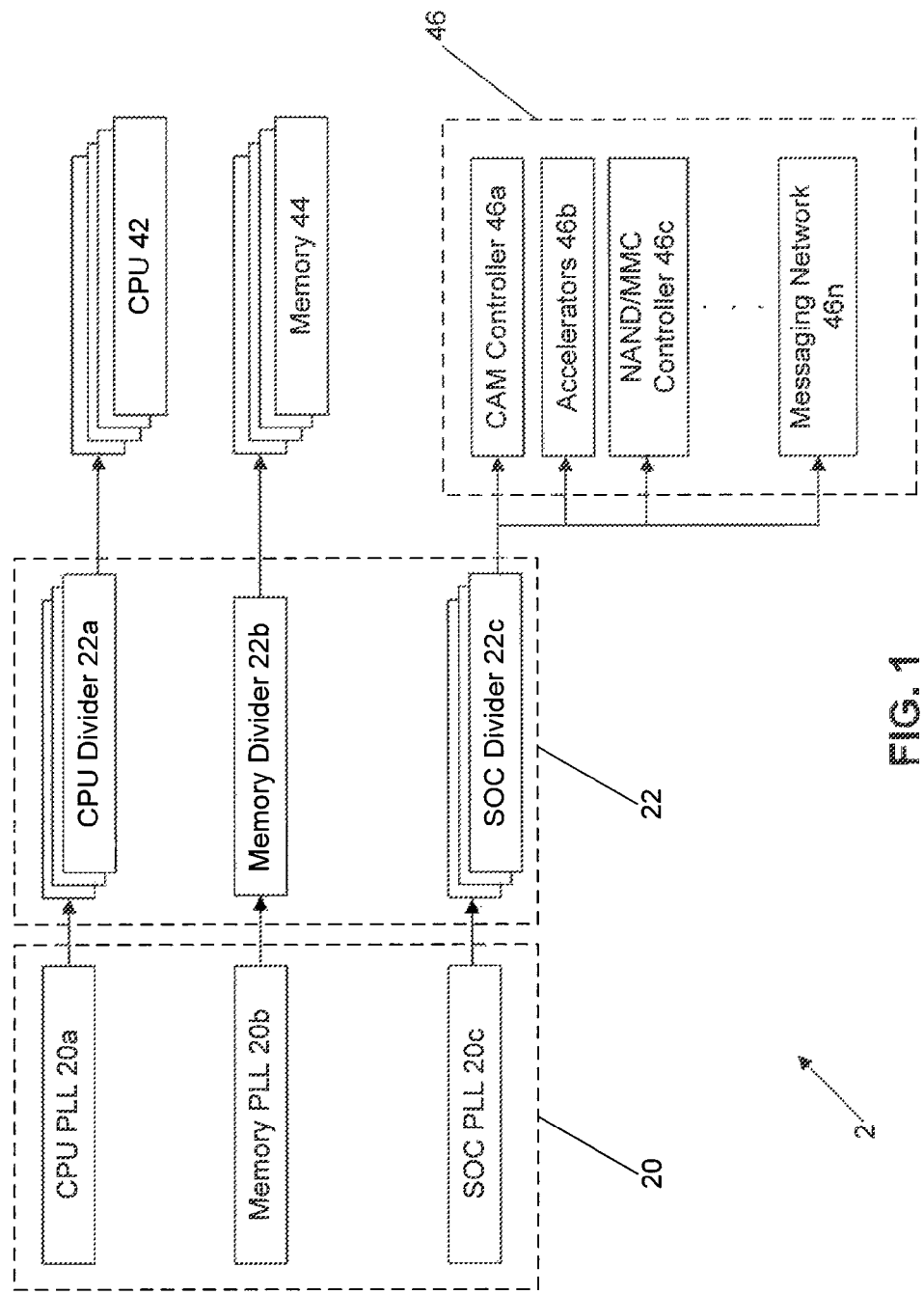
FIG. 1 illustrates a clock management system having a multi-part PLL.

FIG. 1 illustrates a high level diagram of a clock management circuit 2 according to some embodiments. The clock management circuit 2 is operable to generate clock signals that are utilized by multiple disparate portions or multiple categories of subsystems within a larger electronic system or chip. Clock management circuit 2 includes a multi-part phase locked loop circuit 20 that feeds clock outputs to a multi-part divider circuit 22.

Multi-part phase locked loop circuit 20 includes multiples PLLs that are specific to the different types of components and subsystems in the circuit which will require a clock signal. For example, phase locked loop circuit 20 may include a CPU PLL 20*a* that generates a clock output to be used by CPUs, processors, and/or processor cores. The phase locked loop circuit 20 may also include a memory PLL 20*b* for generating a clock output to be used by memory components, such as DRAM memory components. In addition, the phase locked loop 20 may include a SoC PLL 20*c* that generates a clock output to be used by various subsystems, engines, controllers, engines, and other system components, e.g., which are implemented as system on chips (SoCs). While only three PLLs 20a, 20b, and 20c are shown in this example (which correspond to clock signals for certain specific components types), it is noted that different embodiments may be implemented which include additional PLLs and/or additional combinations of PLLs to generate clock outputs for other types or combinations of system components.

Some or all of the outputs from the multi-part phase locked loop circuit 20 may be provided to a multi-part divider circuit 22 to provide a frequency scaled clock from the PLLs 20a, 20b, and 20c to multiple downstream components. One or more CPU dividers 22a are used to provide CPU clock signal(s) from the CPU PLL 20a to be consumed by CPUs, processors, and/or processor cores 42. In a multiprocessor or multi-core processor system, there will be multiple CPU dividers 22a to provide clocks to the multiple CPUs, processors, and/or processor cores 42. A memory divider 22b is used to provide a frequency scaled clock from the memory PLL 20b to be consumed by memory components 44.

A SoC divider 22c is used to provide a frequency scaled clock to downstream components 46, such as subsystems, engines, accelerators, and/or controllers. Examples of such downstream SoC components 46 include, for example, CAM controllers 46a, accelerators 46b, NAND/MMC controllers 46c, and a messaging network 46n. Other examples of such components not shown in the figure include Flash interfaces, compression engines, a GPU, data transfer engines, RAID engines, encryption engines, security acceleration engines, network acceleration engines, and/or RSA/ECC engines. In this way, the system 2 can provide a dedicated divider circuit to specific components/component types, e.g., where a SoC PLL generates a clock output to a SoC divider that is dedicated to CAM devices.

Figure 2:
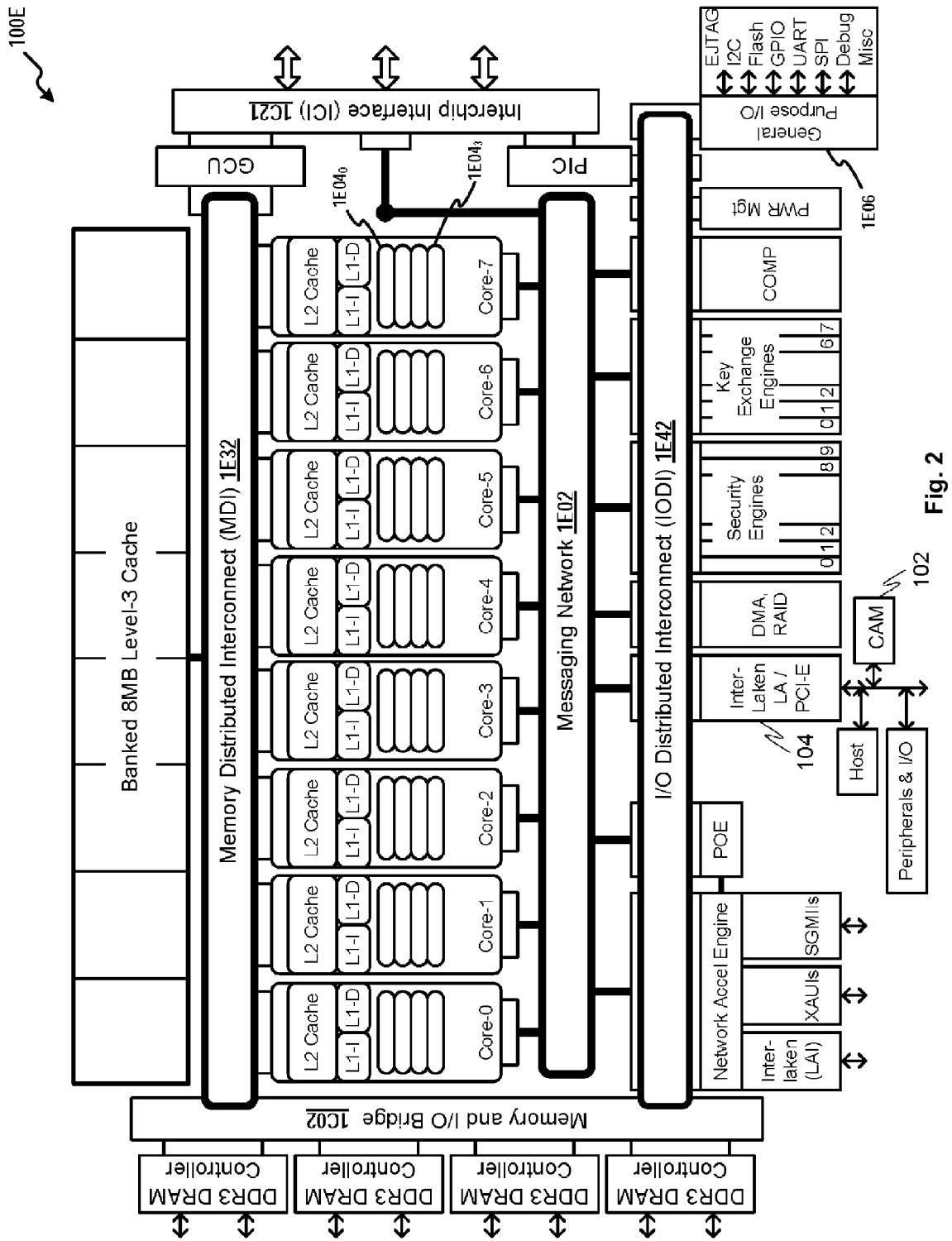
FIG. 2 illustrates an example system in which a multi-part PLL may be employed to generate clock signals.

The multi-part phase locked loop circuit of the present disclosure can be used in any type of system that requires and consumes multiple disparate clock frequencies in the different parts of the system. FIG. 2 depicts an example processing system 100E that may utilize the clock management circuit 2 of FIG. 1 to generate clock signals for the different components within the system 100E. The processing system 100E has three bidirectional communication rings (each depicted as a bold-line oval), a plurality of CPUs (e.g. Core-0, Core-1, etc), a plurality of accelerators (e.g. Network Acceleration Engine, POE, Interlaken-LAI) to perform a set of operations, and a plurality of IO blocks (e.g. ICI, general purpose I/O 1E06, etc). The three rings can be used for referring to and/or moving packets within the context of an on-chip network.

As shown, each instance of the plurality of CPUs (e.g. Core-0, Core-1, etc) comprises its respective level two cache (e.g. the respective L2 cache, as shown), and comprises its respective level one cache for instructions (e.g. the respective L1-I cache) and its respective level one cache for data (e.g. the respective L1-D cache). Each of the CPUs has a virtual CPU (e.g. $1E04_0, \ldots 1E04_3$) depicted as an oval within a core.

In some embodiments, the Memory Distributed Interconnect 1E32 (MDI) comprises a memory interconnect ring, the messaging network 1E42 comprises a messaging ring, and the I/O distributed interconnect 1E42 (IODI) comprises an IO interconnect ring. Also shown is a packet ordering engine (POE) to distribute packets in a particular order to a networking output. In this embodiment, the POE connects to the network acceleration engine (shown as, Network Accel Engine).

In the embodiment shown, the processing system 100E includes an L3 cache to connect to the MDI ring (e.g. an example of a memory interconnect ring 132). The interconnect serves to connect memory elements to other memory elements, possibly using a message station or direct memory access logic. For example, in some embodiments, an instance of a CPU (e.g. Core-0) includes one or more cache memories local to the CPU, and the local cache can be connected to the Memory Distributed Interconnect 1E32 ring. A memory interconnect ring 1E32 can be configured to any width, including any width of any interconnected memory, or even multiples of widths of any interconnected memory, or even fractions of the width of any interconnected memory.

The processing system 100E depicts an I/O distributed interconnect 1E42 (an example of an IO interconnect ring 142), which I/O distributed interconnect 1E42 serves to connect IO blocks (e.g. PCI-E, POE, etc) and accelerators (e.g. security engines) to each other, and to the fast messaging network (as shown).

The accelerators can be located and configured to perform any specific operation. In some cases, one or more accelerators can be configured to perform such a specific operation autonomously (e.g. without intra-operation intervention by a CPU) and, in some cases, one or more accelerators can be configured to perform operations under programmatic control, which programmatic control can be implemented in any combination of configuration registers and sequencing units (e.g. a finite state machine, a micro-sequencer, etc). The Interlaken LA/PCI-E (104) may be a single module or two separate modules. The Interlaken LA of 104 may be individually enabled or disabled while the PCI-E is always enabled in some embodiments. The Interlaken LA/PCI-E (104) interacts with a number of devices, including for example, a CAM devices 102 (also referred to as a "knowledge based processor" or "KBP"), a host, and peripherals and I/O. The clock management system described above may be used to generate a clock that is consumed by CAM device 102.

Further details regarding an exemplary processing system that may be used to implement the system of FIG. 2 is described in U.S. patent application Ser. No. 13/107,809 filed May 13, 2011, entitled "IMPLEMENTING INTEGRATED NETWORKING FUNCTIONS AT WIRE SPEED", which is hereby expressly incorporated by reference in its entirety.

Figure 3:
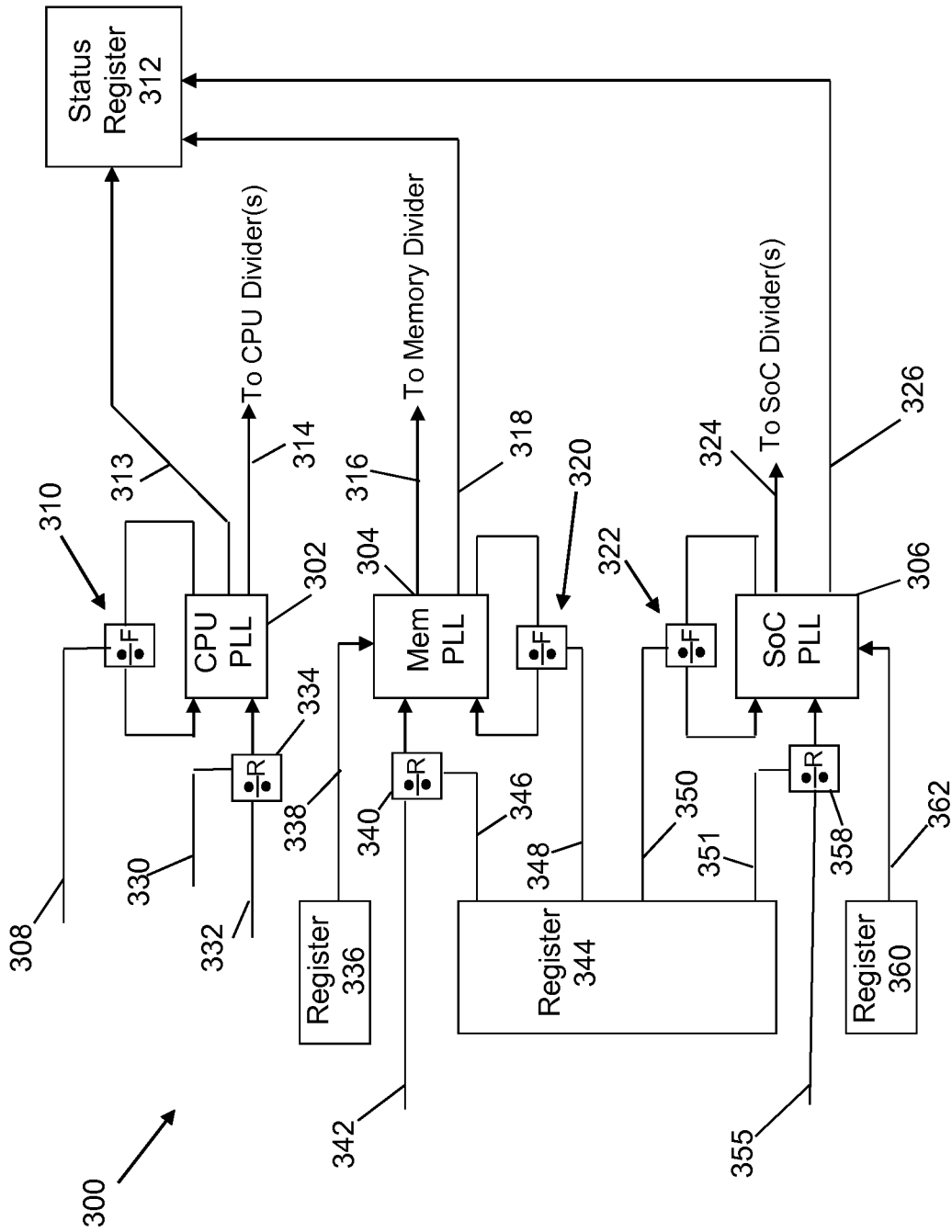
FIG. 3 shows a diagram of a multi-part PLL circuit.

FIG. 3 shows a diagram of an example multi-part phase locked loop circuit 300. Multi-part phase locked loop circuit 300 includes a CPU PLL 302, a memory PLL 304, and a SoC PLL 306.

Figure 4:
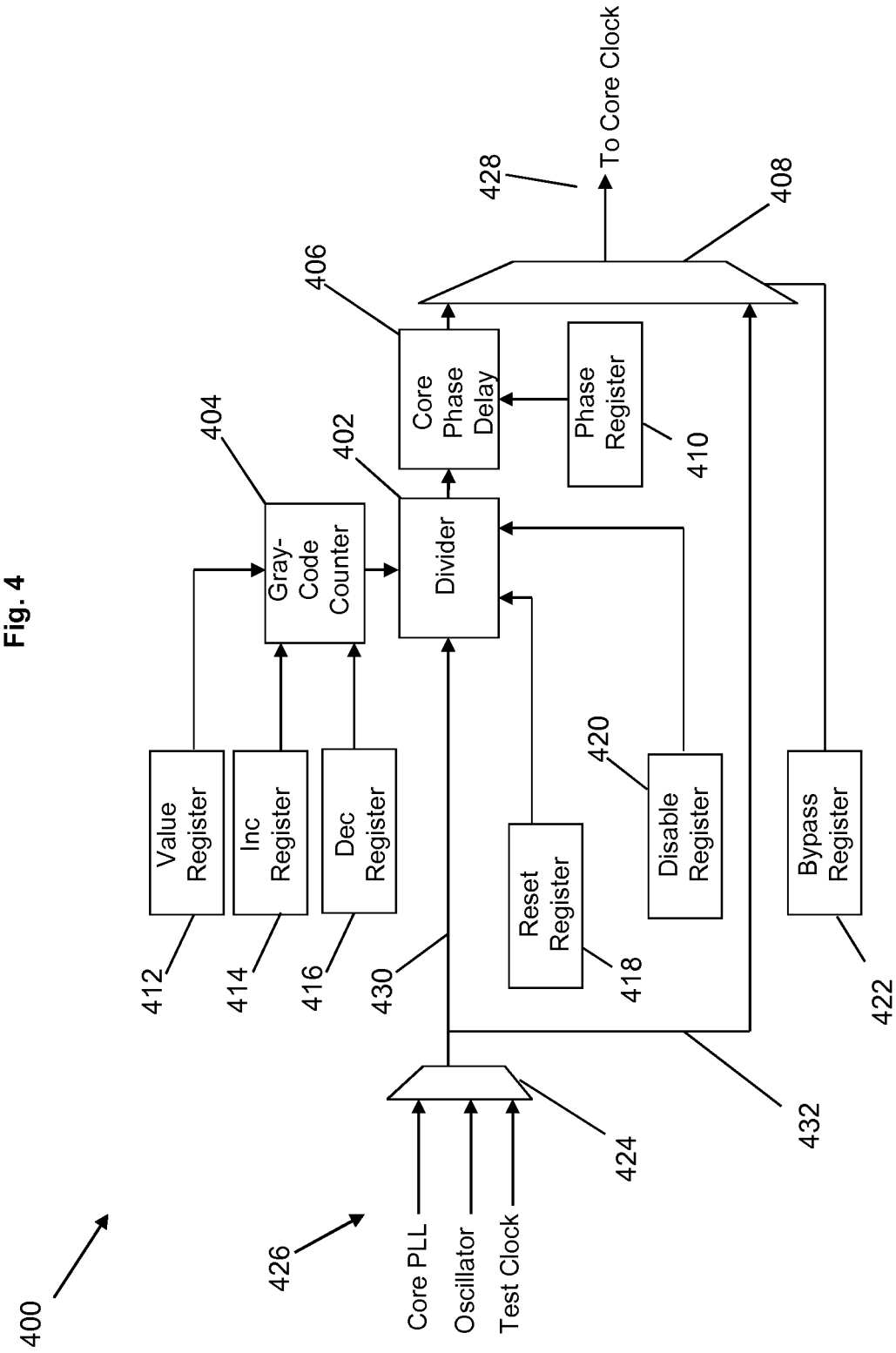
FIG. 4 shows a diagram of a divider circuit to receive a clock output from a multi-part PLL circuit.

The CPU PLL 302 operates to provide a clock output on line 314 to a CPU divider (shown in FIG. 4). The output clock signal generated by the CPU PLL 302 is used by downstream CPU(s), processor(s), and/or processor core(s).

In some embodiments the ratio of the output frequency of the CPU PLL 302 with respect to the input frequency is determined by reference and feedback divider levels according to Equation 1:

$$\text{Frequency}_{out} = [(\text{Frequency}_{in}/R) \times (F+1) \times 4]/2 \qquad \text{Equation 1}$$

The input value on line 308 allows for a specified frequency input value (e.g., a user specified value) to be provided (e.g., at the boot-up time of the circuit), which is used to control the divider of the feedback loop 310, and which corresponds to the "F" value of Equation 1. The reference clock signal is provided on line 332, which is the "Frequency$_{in}$" value of Equation 1. Line 330 provides another input value that may be specified to be applied at boot-up time, which is applied to the reference divider 334 and which corresponds to the "R" value of Equation 1. The CPU PLL outputs a lock signal on line 313, which is sent to a status register 312.

The memory PLL 304 operates to provide an output clock signal on line 316 to a memory divider. The clock output generated by the memory PLL 304 is used by downstream memory components, after being suitably divided by a divider circuit (shown in FIG. 5).

The ratio of the output frequency of the memory PLL 304 with respect to the input frequency is determined by reference and feedback divider levels according to the Equation 1 that was provided above. The reference clock is provided on line 342, which corresponds to the "Frequency$_{in}$" value of Equation 1. Line 346 from the control register portion 344 provides an input value corresponding to the "R" value of Equation 1, which is applied to the reference divider 340. The input value on line 348 from the control register 344 corresponds to the "F" value in Equation 1, and is applied to the frequency divider 320 to implement a feedback loop.

A reset signal may be applied to the memory PLL on line 338. The reset signal value is provided from the control register portion 336. In the reset state, the PLL is powered down and the output to the divider circuit is forced low. The memory PLL 304 outputs a lock signal on line 318, which is sent to the status register 312.

The SoC PLL 306 operates to provide a clock output on line 326 to a SoC divider. The output clock signal generated by the SoC PLL 306 is used by downstream subsystems, engines, accelerators, and/or controllers, such as a CAM controller, NAND controller, MMC controller, messaging network, Flash interface, compression engine, GPU, data transfer engine, RAID engine, encryption engine, security acceleration engine, network acceleration engine, and/or RSA/ECC engine.

As with the other PLLs, the ratio of the output frequency of the SoC PLL 306 with respect to the input frequency is determined by reference and feedback divider levels according to Equation 1. The reference clock is provided on line 355, which corresponds to the "Frequency$_{in}$" value of Equation 1. Line 351 from the control register portion 344 provides an input value corresponding to the "R" value of Equation 1, which is applied to the reference divider 358. The input value on line 350 from the control register 344 corresponds to the "F" value in Equation 1, and is applied to the frequency divider 322 to implement a feedback loop.

A reset signal may be applied to the SoC PLL on line 362. The reset signal value is provided from the control register portion 360. In the reset state, the PLL is powered down and the output to the divider circuit is forced low. The SoC PLL 306 outputs a lock signal on line 324, which is sent to the status register 312.

FIG. 4 shows a schematic of an example CPU divider circuit 400. In some embodiments, each core of a multi-core processor (such as the system shown in FIG. 2) corresponds to its own dedicated CPU divider 400. This enables independent clock control for each individual core. While the circuit shown in FIG. 4 is for a single core, the registers may be shared among the multiple cores with different bit fields in the registers controlling the dividers for all the cores.

The CPU divider 400 includes a dynamic frequency selection divider (DFS) 402, which allows for dynamic frequency clocking that enables the circuit to dynamically operate at different frequencies depending on the instruction being executed. A gray-code counter 404 is employed to dynamically control the frequency generated by the divider 402. The divider values can be incremented or decremented using the gray-code counter 404. This allows the device to employ a high divider value at power-up, to start up with a low clock frequency, and then decrement the divider 402 until the frequency has ramped up to the operating frequency. The divider value is provided by register 412, the increment value is provided by register 414, and the decrement value is provided by register 416.

The phase delay block 406 is used to impose phase delays for the CPU clock. In some embodiments, when the PLL circuit is used in an 8-core system there are four phase relationships between the eight core clocks, where the basic unit of phase change is 90 degrees. The phase delay block 406 is controlled an input from control register 410. This allows for the rising and falling edges of the clocks to be adjusted to reduce noise in the overall system.

Various types of input clocks 426 may be provided to the divider circuit 400 through mux 424. For example, a test clock may be provided that is output from circuit 400 as the core clock 428. The test clock is sent on line 432 through mux 408 to bypass the divider 402. Mux 408 is controlled to perform this bypass based on a bypass control signal from the register 422.

A core PLL output clock is the clock that is provided from CPU 302 (of FIG. 3). This is the output clock 428 that is used to drive the cores in normal operation, when suitably divided by divider 402 and phase adjusted by block 406. In this mode, the control signal from register 422 is used to control mux 408 to pass the output from block 406 instead of line 432 as the clock signal on line 428.

An oscillator clock may be used as a reference clock for the system. This type of clock is used if the entire system is to be run on the same clock, e.g., if the entire circuit is to be run in a scan or test mode. This type of clock would also travel through line 432 to bypass the divider 402 and phase delay block 406.

The divider 402 can be disabled or reset. When disabled or reset, the divider output is set low. The "reset" control signal is provided from control register 418. The "disable" control signal is provide from control register 420.

FIG. 5 shows a schematic of an example divider circuit 500 that can be used to implement either the memory divider or the SoC divider. In some embodiments, there are multiple SoC divider circuits that each are dedicated to a specific downstream SoC component, which enables independent clock control for each SoC component. For example, one of the divider circuits 500 can be dedicated to CAM devices in the overall processing system. However, a single divider 500 can be implemented to handle multiple memory components of the same type, e.g., to handle multiple DRAM memory components.

Like the divider circuit shown in FIG. 4, the divider circuit 500 of FIG. 5 includes a dynamic frequency selection divider (DFS) 502 which allows for dynamic frequency clocking that enables the circuit to dynamically operate at different frequencies. While the register functions are similar, a different set of control registers are used in the circuit of FIG. 5 as compared to those used in the circuit of FIG. 4. One difference is that a phase delay register is not needed for the circuit of FIG. 4. This because the clocking frequencies needed for the SoC and memory clocks are relatively less prone to noise as compared to the core clocks, and therefore will not need the phase delays that may be needed for the core clocks.

A gray-code counter 504 is employed to dynamically control the frequency generated by the divider 502 in circuit 500. As before, the divider values can be incremented or decremented using the gray-code counter 504, which allows the device to employ a high divider value at power-up, to start up with a low clock frequency, and then decrement the divider 502 until the frequency has ramped up to the operating frequency. The divider value is provided by register 512, the increment value is provided by register 514, and the decrement value is provided by register 516.

Input clocks 526 may be provided to the divider circuit 500 through mux 524. The input clock from the previous PLL stage is also provided on line 530 through mux 524. When the circuit 500 is used as a memory divider, the clock is provided from the memory PLL 304. When the circuit 500 is used as a SoC divider, the clock is provided from the SoC PLL 304. These are the clocks that drive the normal operation of memory and SoCs from the divider circuit 500. In this mode, a control signal from register 522 is used to control mux 508 to output a clock signal 528 from the divider 502.

The circuit 500 may also be used in a bypass mode, where mux 408 is controlled by a bypass signal from the register 422 to send the signal on line 432 through mux 508 to bypass the divider 502. For example, a test clock or oscillator clock may be provided as inputs 526 on line 532 through mux 524 which bypasses the divider 502 in the bypass mode.

The divider 502 can be disabled or reset. When disabled or reset, the divider output is set low. The "reset" control signal is provided from control register 518. The "disable" control signal is provide from control register 520.

Therefore, what has been described is an improved approach for implementing a clock management system. The multi-part phase locked loop circuit of the disclosure is provided to handle the different clock needs of the circuit, where each of the phase locked loops within the multi-part phase locked loop circuit may feed a clock output to one or more divider circuits. The divider circuits may be dedicated to specific components. For example, a SoC PLL may generate a clock output to a SoC divider that is dedicated to providing a clock to content address memory (CAM) components. This approach allows the clock management system to efficiently generate clock signals with variable levels of frequencies, even for complicated circuits having many different functional portions and components, and therefore different clock needs for the different portions of the system.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

The invention claimed is:

1. A system, comprising:
a plurality of processor cores;
a memory component;
a content addressable memory;
a first phase locked loop circuit to output a first clock output for the plurality of processor cores;
a second phase locked loop circuit to output a second clock output for the memory component;
a third phase locked loop circuit to output a third clock output for the content addressable memory;
a plurality of first divider circuits coupled to the first phase locked loop circuit to frequency scale the first clock output for consumption by the plurality of processor cores, in which each processor core from the plurality of processor cores is associated with a dedicated first divider circuit;
a second divider circuit coupled to the second phase locked loop circuit to frequency scale the second clock output for consumption by the memory component; and
a plurality of third divider circuits coupled to the third phase locked loop circuit to frequency scale the third clock output, in which the content addressable memory is associated with a dedicated third divider circuit, wherein
a first divider circuit, from among the plurality of first divider circuits the second divider circuit, or a third divider circuit from the plurality of third divider circuits, is implemented as a dynamic frequency selection divider, the dynamic frequency selection divider bein controlled by a counter.

2. The system of claim 1, wherein the third phase locked loop circuit and the plurality of third divider circuits are to provide the third clock output to SoC components.

3. The system of claim 2, wherein the plurality of third divider circuits is to provide the third clock output to a SoC component corresponding to a controller for the content addressable memory.

4. The system of claim 2, wherein the SoC components comprise a NAND controller, an MMC controller, a messaging network, a Flash interface, a compression engine, a GPU, a data transfer engine, a RAID engine, an encryption engine, a security acceleration engine, a network acceleration engine, or an RSA/ECC engine.

5. The system of claim 2, wherein an individual SoC component or component type corresponds to a dedicated divider circuit.

6. The system of claim 1, wherein the counter is a gray-code counter.

7. The system of claim 1, wherein the plurality of first divider circuits further comprises a phase delay block to impose a phase delay output.

8. A method for implementing clock management, comprising:
generating a first clock output with a first phase locked loop circuit;
generating a second clock output with a second phase locked loop circuit;
generating a third clock output with a third phase locked loop circuit;
utilizing a plurality of first divider circuits coupled to the first phase locked loop circuit to frequency scale the first clock output for consumption by a plurality of processor cores, in which each processor core from the plurality of processor cores is associated with a dedicated first divider circuit;
utilizing a second divider circuit coupled to the second phase locked loop circuit to frequency scale the second clock output for consumption by a memory component; and
utilizing a plurality of third divider circuits coupled to the third phase locked loop circuit to frequency scale the third clock output for consmnption by a content addressable memory, in which the content addressable memory is associated with a dedicated third divider circuit, wherein
first divider circuit, from among the plurality of first divider circuits, the second divider circuit, or a third divider circuit, from the plurality of third divider circuits, is implemented as a dynamic frequency selection divider, the dynamic frequency selection divider being controlled by a counter.

9. The method of claim 8, wherein the third phase locked loop circuit and the plurality of third divider circuits provide the third clock output to SoC components.

10. The method of claim 9, wherein the plurality of third divider circuits provide the third clock output to a SoC component corresponding to a controller for the content addressable memory.

11. The method of claim 9, wherein the SoC components comprise a NAND controller, an MMC controller, a messaging network, a Flash interface, a compression engine, a GPU, a data transfer engine, a RAID engine, an encryption engine, a security acceleration engine, a network acceleration engine, or an RSA/ECC engine.

12. The method of claim 9, wherein an individual SoC component or component type corresponds to a dedicated divider circuit.

13. The method of claim 9, wherein the counter is a gray-code counter.

14. The method of claim 9, wherein a phase delay is imposed for the plurality of first divider circuits.

* * * * *